US008581169B2

(12) United States Patent
Banhegyesi (10) Patent No.: US 8,581,169 B2
(45) Date of Patent: Nov. 12, 2013

(54) SYSTEM AND METHOD FOR DATA TRANSMISSION BETWEEN AN INTELLIGENT ELECTRONIC DEVICE AND A REMOTE DEVICE

(75) Inventor: Tibor Banhegyesi, Baldwin, NY (US)

(73) Assignee: Electro Industries/Gauge Tech, Westbury, NY (US)

( * ) Notice: Subject to any disclaimer, the term of this patent is extended or adjusted under 35 U.S.C. 154(b) by 263 days.

(21) Appl. No.: 12/791,059

(22) Filed: Jun. 1, 2010

(65) Prior Publication Data

US 2010/0238983 A1 Sep. 23, 2010

Related U.S. Application Data

(63) Continuation-in-part of application No. 12/139,558, filed on Jun. 16, 2008, now Pat. No. 7,897,905, which is a continuation of application No. 11/042,588, filed on Jan. 24, 2005, now Pat. No. 7,388,189.

(51) Int. Cl.
*G01J 1/42* (2006.01)
*H04B 10/20* (2011.01)

(52) U.S. Cl.
USPC .......................... 250/208.4; 398/58

(58) Field of Classification Search
USPC ............... 250/208.4, 227.11, 227.24, 227.12, 250/227.14; 385/55–59; 398/58, 59, 66–72
See application file for complete search history.

(56) References Cited

U.S. PATENT DOCUMENTS

| | | | |
|---|---|---|---|
| 3,780,433 A | 12/1973 | Lynch | |
| 3,796,953 A | 3/1974 | Zisa et al. | |
| 4,050,621 A | 9/1977 | Bouley | |
| 4,072,385 A | 2/1978 | Wallner | |
| 4,092,592 A | 5/1978 | Milkovic | |
| 4,301,543 A | 11/1981 | Palmer | |
| 4,458,307 A | 7/1984 | McAnlis | |
| 4,531,240 A | 7/1985 | Yokomizo | |
| 4,713,609 A | 12/1987 | Losapio et al. | |
| 4,811,284 A * | 3/1989 | Adler et al. | ..................... 710/56 |
| 4,839,819 A | 6/1989 | Begin et al. | |
| 4,843,311 A | 6/1989 | Rozman et al. | |
| 4,851,614 A | 7/1989 | Duncan, Jr. | |

(Continued)

FOREIGN PATENT DOCUMENTS

WO    WO98/54583    12/1998

OTHER PUBLICATIONS

Clark, "Printed Circuit Engineering: Optimizing for Manufacturability," 1989, pp. 34-35, 38-40, 163.

(Continued)

*Primary Examiner* — Georgia Y Epps
*Assistant Examiner* — Don Williams
(74) *Attorney, Agent, or Firm* — Gerald E. Hespos; Michael J. Porco; Matthew T. Hespos (57) ABSTRACT

A system and method for data transmission between an intelligent electronic device (IED) and a device, such as a remote display or input/output (I/O) device, are provided. Each data line of the IED is input into a serializer and transmitted over a serial link to a deserializer and then provided to the inputs of remote device, such as a remote display or input/output (I/O) device. The serial link can be made of any media such as copper, fiber optics, etc. The serial link can be formed as one, two or more channels.

38 Claims, 4 Drawing Sheets

(56) References Cited

U.S. PATENT DOCUMENTS

| | | | |
|---|---|---|---|
| 5,017,860 A | 5/1991 | Germer et al. | |
| 5,207,595 A | 5/1993 | Learmont et al. | |
| 5,210,632 A | 5/1993 | Murakami et al. | |
| 5,248,967 A | 9/1993 | Daneshfar | |
| 5,293,115 A | 3/1994 | Swanson | |
| 5,301,122 A | 4/1994 | Halpern | |
| 5,418,752 A | 5/1995 | Harari | |
| 5,459,459 A | 10/1995 | Lee, Jr. | |
| 5,528,507 A | 6/1996 | McNamara et al. | |
| 5,548,527 A | 8/1996 | Hemminger | |
| 5,555,508 A | 9/1996 | Munday | |
| 5,623,507 A * | 4/1997 | Burns et al. | 714/765 |
| 5,631,554 A | 5/1997 | Briese et al. | |
| 5,631,843 A | 5/1997 | Munday et al. | |
| 5,680,324 A | 10/1997 | Sweitzer, III et al. | |
| 5,696,501 A | 12/1997 | Oullette | |
| 5,704,535 A | 1/1998 | Thompson, Sr. | |
| 5,715,390 A | 2/1998 | Hoffman et al. | |
| 5,734,571 A | 3/1998 | Piltz et al. | |
| 5,736,847 A | 4/1998 | Van Doorn et al. | |
| 5,742,512 A | 4/1998 | Edge et al. | |
| 5,764,155 A | 6/1998 | Kertesz | |
| 5,768,148 A | 6/1998 | Murphy | |
| 5,933,092 A | 8/1999 | Ouellette | |
| 5,963,734 A | 10/1999 | Ackerman et al. | |
| 5,995,911 A | 11/1999 | Hart | |
| 6,008,711 A | 12/1999 | Bolam | |
| 6,018,700 A | 1/2000 | Edel | |
| 6,124,806 A | 9/2000 | Cunningham | |
| 6,186,842 B1 | 2/2001 | Hirschbold et al. | |
| 6,219,656 B1 | 4/2001 | Cain | |
| 6,236,949 B1 | 5/2001 | Hart | |
| 6,316,932 B1 | 11/2001 | Horan et al. | |
| 6,327,541 B1 | 12/2001 | Pitchford et al. | |
| 6,367,023 B2 | 4/2002 | Kling | |
| 6,429,785 B1 | 8/2002 | Griffin et al. | |
| 6,459,175 B1 | 10/2002 | Potega | |
| 6,459,258 B1 | 10/2002 | Lavoie et al. | |
| 6,459,997 B1 | 10/2002 | Andersen | |
| 6,486,652 B1 | 11/2002 | Oullette et al. | |
| 6,504,357 B1 | 1/2003 | Hemminger et al. | |
| 6,519,509 B1 | 2/2003 | Nierlich | |
| 6,591,229 B1 | 7/2003 | Pattinson et al. | |
| 6,615,147 B1 | 9/2003 | Jonker et al. | |
| 6,618,709 B1 | 9/2003 | Sneeringer | |
| 6,671,635 B1 | 12/2003 | Forth et al. | |
| 6,694,270 B2 | 2/2004 | Hart | |
| 6,735,535 B1 | 5/2004 | Kagan et al. | |
| 6,751,562 B1 | 6/2004 | Blackett et al. | |
| 6,778,920 B1 | 8/2004 | Balch et al. | |
| 6,784,806 B1 | 8/2004 | Lee et al. | |
| 6,798,191 B1 | 9/2004 | MacFarlane et al. | |
| 6,813,571 B2 | 11/2004 | Lightbody et al. | |
| 6,825,776 B2 | 11/2004 | Lightbody et al. | |
| 6,871,150 B2 | 3/2005 | Huber et al. | |
| 6,885,185 B1 | 4/2005 | Makinson et al. | |
| 6,889,271 B1 | 5/2005 | Germer et al. | |
| 6,895,189 B1 | 5/2005 | Bedrosian | |
| 6,944,555 B2 | 9/2005 | Blackett et al. | |
| 6,954,814 B1 | 10/2005 | Leach | |
| 6,961,641 B1 | 11/2005 | Forth et al. | |
| 6,983,211 B2 | 1/2006 | MacFarlene et al. | |
| 6,988,025 B2 | 1/2006 | Ransom et al. | |
| 6,990,395 B2 | 1/2006 | Ransom et al. | |
| 7,085,824 B2 | 8/2006 | Forth et al. | |
| 7,158,050 B2 | 1/2007 | Lightbody et al. | |
| 7,184,904 B2 | 2/2007 | Kagan | |
| 7,295,776 B2 | 11/2007 | Okubo et al. | |
| 7,388,189 B2 | 6/2008 | Spanier et al. | |
| 7,477,998 B2 | 1/2009 | Kagan | |
| 7,897,905 B2 | 3/2011 | Spanier et al. | |
| 7,953,565 B2 | 5/2011 | Kagan | |
| 7,994,934 B2 | 8/2011 | Kagan | |
| 2002/0039068 A1 | 4/2002 | Holowick | |
| 2002/0082748 A1 | 6/2002 | Enga | |
| 2002/0161536 A1 | 10/2002 | Suh et al. | |
| 2003/0065459 A1 | 4/2003 | Huber et al. | |
| 2003/0101008 A1 | 5/2003 | Hart | |
| 2003/0105608 A1 | 6/2003 | Hart | |
| 2003/0184448 A1 | 10/2003 | Kagan | |
| 2003/0212512 A1 | 11/2003 | Hart | |
| 2003/0220752 A1 | 11/2003 | Hart | |
| 2004/0066311 A1 | 4/2004 | Giles et al. | |
| 2004/0070517 A1 | 4/2004 | Ehrke et al. | |
| 2004/0138787 A1 | 7/2004 | Ransom et al. | |
| 2004/0138835 A1 | 7/2004 | Ransom et al. | |
| 2004/0183522 A1 | 9/2004 | Gunn et al. | |
| 2004/0229578 A1 | 11/2004 | Lightbody et al. | |
| 2005/0015219 A1 * | 1/2005 | Lightfoot et al. | 702/188 |
| 2005/0017874 A1 | 1/2005 | Lightbody et al. | |
| 2005/0125361 A1 | 6/2005 | Girsham et al. | |
| 2005/0215244 A1 | 9/2005 | Whitson | |
| 2006/0023853 A1 | 2/2006 | Shelley et al. | |
| 2006/0077999 A1 | 4/2006 | Kagan et al. | |
| 2006/0082468 A1 | 4/2006 | Wang et al. | |
| 2006/0161396 A1 | 7/2006 | Kagan | |
| 2006/0230394 A1 | 10/2006 | Forth et al. | |
| 2007/0185666 A1 | 8/2007 | Kagan | |
| 2009/0112494 A1 | 4/2009 | Kagan | |

OTHER PUBLICATIONS

Judd et al., "Soldering in Electronics Assembly," 1st Edition, 1992, pp. 1-20.

Internet Technology Aids Plant Operations, Power Engineering (Aug. 1998).

Motorola Preliminary Information Application Brief, "Electronic Energy Meter with Powerline Modem on DSP56F80x," undated, 2 pages, copyright (2000).

Series 5500 Infonode User's Guide; Dranetz-BMI, Revision D 1992, 2002, 2004, pp. i-A12.

http:www.landisgyr.us/Landis_Gyr/Meters/2510_socket_meter. asp (dated Mar. 21, 2005), 16 pages.

PowerLogic Circuit Monitor Series 2000 Reference Manual; Square D Company; Instructin Bulletin No. 3020IM9806; Feb. 1999.

DX-9100 Extended Digital Controller Technical Manual; Johnson Controls, Inc.; Code No. LIT-6364020; Aug. 1996.

Sezi et al., "New intelligent electronic devices change the structure of power distribution systems"; Oct. 1999, Industry Applications Conference, 1999. 34th IAS Meeting Conference Record of the 1999 IEEE, vol. 2, pp. 944-952.

* cited by examiner

Front View
FIG. 1A

Side View
FIG. 1B

Rear View
FIG. 1C

SYSTEM AND METHOD FOR DATA TRANSMISSION BETWEEN AN INTELLIGENT ELECTRONIC DEVICE AND A REMOTE DEVICE

This application is a continuation-in-part application of U.S. application Ser. No. 12/139,558 filed on Jun. 16, 2008, now U.S. Pat. No. 7,897,905, which is a continuation application of U.S. application Ser. No. 11/042,588, filed Jan. 24, 2005, now U.S. Pat. No. 7,388,189, the contents of all of which are hereby incorporated by reference in their entireties.

BACKGROUND

1. Field

The present disclosure relates to a system and method for data transmission system between an intelligent electronic device (IED) and a remote display or input/output (I/O) device. In particular, the present disclosure relates to a system and method for data transmission between an IED and a remote display or I/O device that minimizes the number of digital lines needed for a large number of data channels. In addition, the present disclosure provides for the use of a fiber optic medium for the data transmission thereby providing for a fast transmission system and method which is intrinsically isolated and electrically non-conductive.

2. Description of the Related Art

Electric utility companies ("utilities") track electric usage by customers by using power meters. These meters track the amount of power consumed at a particular location. These locations range from power substations, to commercial businesses, to residential homes. The electric utility companies use information obtained from the power meter to charge their customers for their power consumption, i.e., revenue metering.

A popular type of power meter is the socket-type power meter, i.e., S-base or Type S meter. As its name implies, the meter itself plugs into a socket for easy installation, removal and replacement. Other meter installations include panel mounted, switchboard mounted, and circuit breaker mounted. Typically, the power meter connects between utility power lines supplying electricity and a usage point, namely, a residence or commercial place of business.

A power meter may also be placed at a point within the utility's power grid to monitor power flowing through that point for distribution, power loss, or capacity monitoring, e.g., at a substation. These power and energy meters are installed in substations to provide a visual display of real-time data and to alarm when problems occur. These problems include limit alarms, breaker control, outages and many other types of events.

Intelligent electronic display devices provide valuable data for display and for processing by other equipment, e.g., another IED, a head end of a SCADA system, computing device, etc. There are typically multiple data lines to be transmitted from perhaps an IED to a display (or another device) at a remote location. Multiple data lines can be extremely costly to install, e.g., depending on a number of lines (i.e., multi-conductor cables) to be run and the size of a raceway (i.e., metal conduit) to hide or protect the multi-conductor cables. Further, transmission of this data by a high speed medium such as fiber optics requires a separate line for each data line and this would prove costly.

Figure 1A:
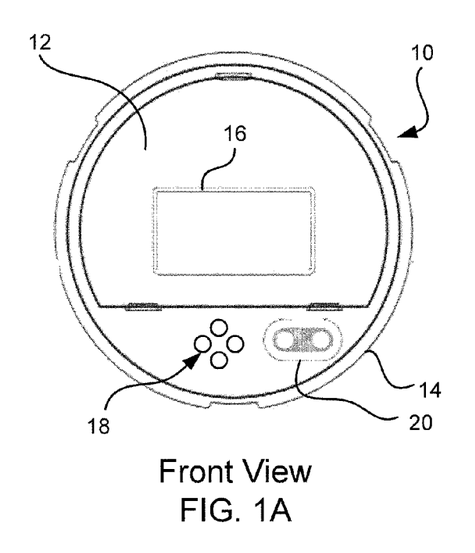
FIGS. 1A-C illustrates an socket-type meter.
Figure 1B:
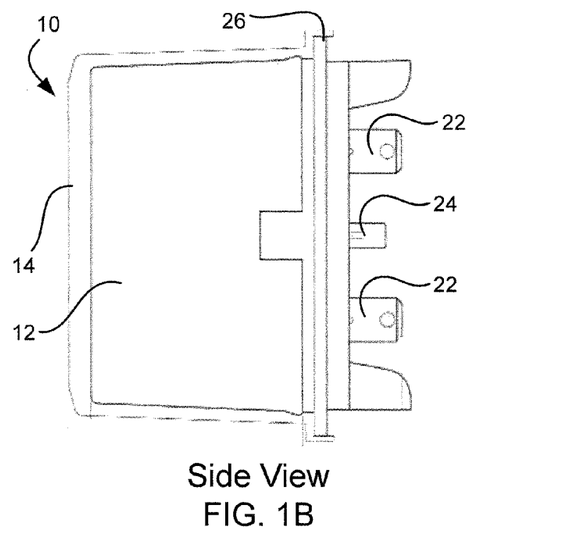
Figure 1C:
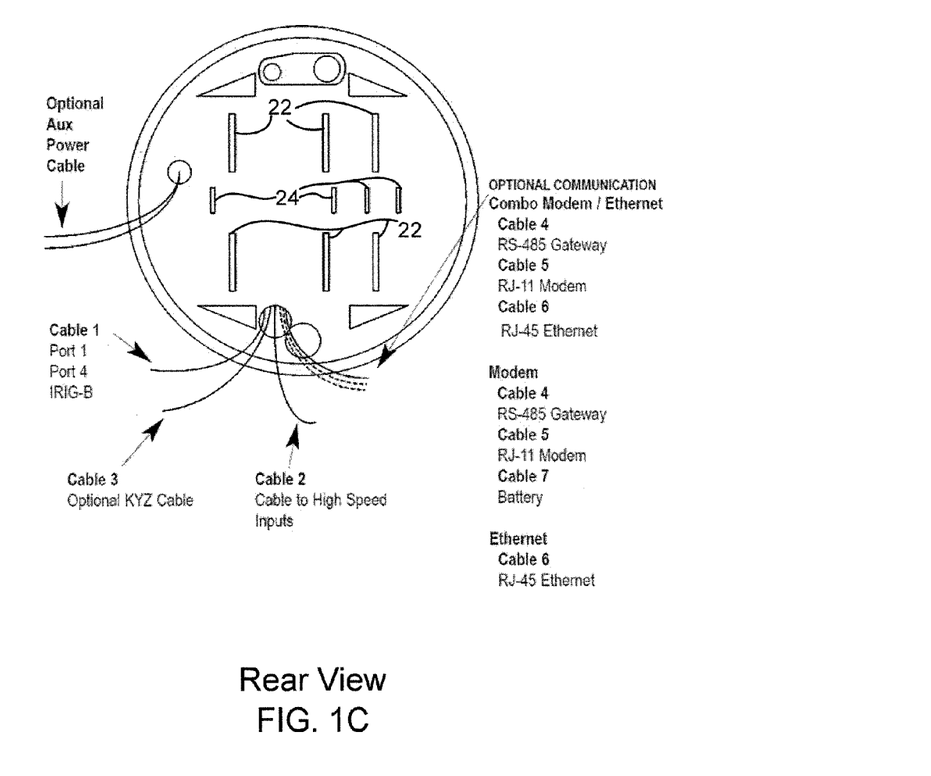

For example, FIGS. 1A-C illustrate a typical socket-type power meter. An exemplary socket meter is described in commonly owned U.S. patent application Ser. No. 12/578,062, the contents of which are hereby incorporated by reference in its entirety. The meter includes a main housing 12 surrounded by a cover 14. The cover 14 is preferably made of a clear material to expose a display 16 disposed on the main body 12. An interface 18 to access the display and a communication port 20 is also provided and accessible through the cover 14. The meter 10 further includes a plurality of current terminals 22 and voltage terminals 24 disposed on backside of the meter. The terminals 22, 24 are designed to mate with matching jaws of a detachable meter-mounting device, such as a revenue meter socket. The socket is hard wired to the electrical circuit and is not meant to be removed. To install an S-base meter, the utility need only plug in the meter into the socket. Once installed, a socket-sealing ring 26 is used as a seal between the meter 10 and/or cover 14 and the meter socket to prevent removal of the meter and to indicate tampering with the meter. However, installation of the meter 10 is complicated by the plurality cable extending through the rear side of the meter as shown in FIG. 1C.

In the configuration shown, at least seven cables for communications and remote signaling leave the rear side of the meter 10. This bundle of cables slows the installation process since great care must taken not to pinch any of the cable as the meter is mated to the socket. Furthermore, the installer must ensure the bundle of cables is separated from any high voltage, which may effect the signals being transmitted over the bundle.

Therefore, a need exists for a high speed data transmission system and method for transmitting data from an IED to a remote display, another IED, input/output devices (I/O), computing devices and the like. Furthermore, a need exists for such a system and method to utilize less external wiring which will result in lower manufacturing costs and reduced installation time and costs.

SUMMARY

A system and method for data transmission between an intelligent electronic device (IED) and a device, e.g., a remote display, another IED, input/output devices (I/O), computing devices and the like, are provided. An IED has multiple data lines for transmission from the IED to a remote device. Each data line of the IED is input into a serializer and transmitted over a serial link to a deserializer and then provided to the inputs of a remote device. The serial link can be made of any media such as copper, fiber optics, etc. The serial link can be formed as at least one or two channels. The second channel permits a deserializer at the remote device to communicate with the IED to see if a particular data line is ready to transmit without interfering with any data transmission on the first data channel transmitting from the serializer of the IED to the deserializer of the remote device.

In another embodiment, a serializer/deserializer is provided in each the IED and remote device to enable two-way communications between the IED and remote device. In a further embodiment, the serializer/deserializer is configured as a single integrated circuit.

In further embodiments, the system includes smart chips at either end of a transmission medium, such as a cable, to encode the data and decode the data as appropriate. Encoding/decoding may be performed using a serial sequence or protocol.

BRIEF DESCRIPTION OF THE DRAWINGS

The above and other aspects, features, and advantages of the present disclosure will become more apparent in light of the following detailed description when taken in conjunction with the accompanying drawings in which.

DETAILED DESCRIPTION

It should be understood that the elements shown in the figures may be implemented in various forms of hardware, software or combinations thereof. Preferably, these elements are implemented in a combination of hardware and software on one or more appropriately programmed general-purpose devices, which may include a processor, memory and input/output interfaces.

The present description illustrates the principles of the present disclosure. It will thus be appreciated that those skilled in the art will be able to devise various arrangements that, although not explicitly described or shown herein, embody the principles of the disclosure and are included within its spirit and scope.

All examples and conditional language recited herein are intended for pedagogical purposes to aid the reader in understanding the principles of the disclosure and the concepts contributed by the inventor to furthering the art, and are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that the block diagrams presented herein represent conceptual views of illustrative circuitry embodying the principles of the disclosure. Similarly, it will be appreciated that any flow charts, flow diagrams, state transition diagrams, pseudo-code, and the like represent various processes which may be substantially represented in computer readable media and so executed by a computer or processor, whether or not such computer or processor is explicitly shown.

The functions of the various elements shown in the figures may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor ("DSP") hardware, read only memory ("ROM") for storing software, random access memory ("RAM"), and nonvolatile storage.

Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

The word "exemplary" is used herein to mean "serving as an example, instance, or illustration." Any configuration or design described herein as "exemplary" is not necessarily to be construed as preferred or advantageous over other configurations or designs. Herein, the phrase "coupled with" is defined to mean directly connected to or indirectly connected with through one or more intermediate components. Such intermediate components may include both hardware and software based components.

As used herein, intelligent electronic devices ("IED's") include Programmable Logic Controllers ("PLC's"), Remote Terminal Units ("RTU's"), electric power meters, protective relays, fault recorders and other devices which are coupled with power distribution networks to manage and control the distribution and consumption of electrical power. A meter is a device that records and measures power events, power quality, current, voltage waveforms, harmonics, transients and other power disturbances. Revenue accurate meters ("revenue meter") relate to revenue accuracy electrical power metering devices with the ability to detect, monitor, report, quantify and communicate power quality information about the power which they are metering.

Figure 2:
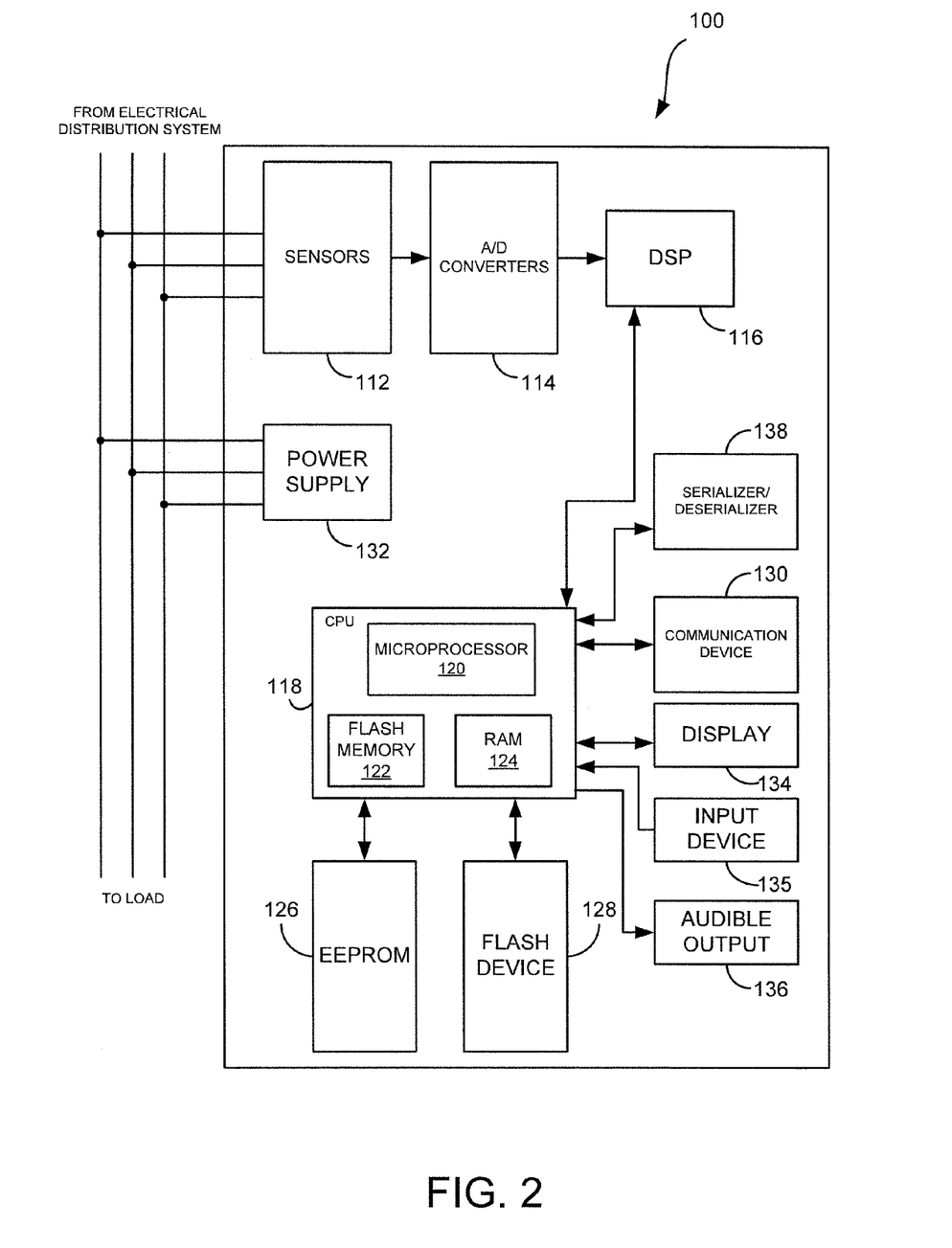
FIG. 2 is a diagram of an intelligent electronic device in accordance with an embodiment of the present disclosure.

An intelligent electronic device (IED) 100 for monitoring and determining an amount of electrical power usage by a consumer and for providing audible and visual indications to a user is illustrated in FIG. 2. Generally, the IED 100 includes sensors 112, a plurality of analog-to-digital (A/D) converters 114 and a processing system including a central processing unit (CPU) 118 and/or a digital signal processor (DSP) 116. The sensors 112 will sense electrical parameters, e.g., voltage and current, of the incoming lines from an electrical power distribution system. Preferably, the sensors will include current transformers and potential transformers, wherein one current transformer and one voltage transformer will be coupled to each phase of the incoming power lines. A primary winding of each transformer will be coupled to the incoming power lines and a secondary winding of each transformer will output a voltage representative of the sensed voltage and current. The output of each transformer will be coupled to the A/D converters 114 configured to convert the analog output voltage from the transformer to a digital signal that can be processed by the CPU 118 or DSP 116.

The CPU 118 is configured for receiving the digital signals from the A/D converters 114 to perform the necessary calculations to determine the power usage and controlling the overall operations of the IED 100. In a preferred embodiment, the DSP 116 will receive the digital signals from the A/D converters 114 and perform the necessary calculations to determine the power usage to free the resources of the CPU 118. The CPU 118 will include a microprocessor 120 executing instructions and performing various calculations, flash memory 122 for storing executable instructions and permanent data tables for controlling the overall operation of the microprocessor and random access memory (RAM) 124 for holding data during computations by the microprocessor 120.

A first memory 126 is coupled to CPU 118 and stores calibration and setup parameters of the IED 10, e.g., meter configuration, serial number of the device, etc. Memory 126 may be an integrated circuit in the form of a FLASH or EEPROM, or any other known or to be developed type of memory which is nonvolatile, capable of being changed in the IED, and amenable to making such changes difficult for an end user.

The IED 100 further includes a second memory 128 for storing sensed and generated data for further processing and for retrieval, e.g., data logs. Memory 128 may be flash memory and may be removable or non-removable. In one embodiment, data stored on memory 128 may be retrieved by an external device or computer via a communication device 130. In another embodiment, where memory 128 is removable, memory 128 will be in the form of a memory card such as a CompactFlash card, a Memory Stick, a SmartMedia card, etc., and data stored therein will be retrieved from an appropriate memory card reader.

A power supply 132 is also provided for providing power to each component of the IED 100. In one embodiment, the power supply 132 is a transformer with its primary windings coupled to the incoming power distribution lines and having an appropriate number of windings to provide a nominal voltage, e.g., 5VDC, at its secondary windings. In other embodiments, power is supplied from an independent source to the power supply 132, e.g., from a different electrical circuit, an uninterruptible power supply (UPS), etc.

The IED 100 of the present disclosure will have a user interface for interacting with a user and for communicating events, alarms and instructions to the user. The user interface will include a display 134 for providing visual indications to the user. The display 134 may include a touch screen, a liquid crystal display (LCD), a plurality of LED number segments, individual light bulbs or any combination of these. The display 134 may provide the information to the user in the form of alpha-numeric lines, computer-generated graphics, videos, etc. The user interface will include an input device 135 for entering data, e.g., parameters, limits, etc. The input device may include pushbuttons, a keypad, a touch screen, at least one dial, etc. The user interface may also include a speaker or audible output means 136 for audibly producing instructions, alarms, data, etc. The speaker 136 will be coupled to the CPU 118 via a digital-to-analog converter (D/A) for converting digital audio files stored in memory to analog signals playable by the speaker 136.

The IED 100 will include the communication device 130 for enabling data communications between the IED 100 and other computing devices, e.g., a desktop computer, laptop computer, other IEDs, etc. The communication device 130 may be a modem, network interface card (NIC), wireless transceiver, etc. As described above, the IED 100 may be coupled to a personal computer over a network, e.g., a LAN, WAN, the Internet, etc., via the communication device 130, where the personal computer will retrieve data, e.g., logs, from the IED 100. The communication device 130 will perform its functionality by hardwired and/or wireless connectivity. The hardwire connection may include but is not limited to hard wire cabling e.g., parallel or serial cables, USB cable, Firewire (1394 connectivity) cables, and the appropriate port. The wireless connection will operate under any of the various known wireless protocols including but not limited to Bluetooth™ interconnectivity, infrared connectivity, radio transmission connectivity including computer digital signal broadcasting and reception commonly referred to as Wi-Fi or 802.11.X (where x denotes the type of transmission), satellite transmission or any other type of communication protocols or systems currently existing or to be developed for wirelessly transmitting data. It is to be appreciated that the network may be a local area network (LAN), wide area network (WAN), the Internet or any known network that couples a plurality of computers to enable various modes of communication via network messages. Furthermore, the IED 100 will communicate using the various known protocols such as Transmission Control Protocol/Internet Protocol (TCP/IP), File Transfer Protocol (FTP), Hypertext Transfer Protocol (HTTP), etc. and secure protocols such as Internet Protocol Security Protocol (IPSec), Point-to-Point Tunneling Protocol (PPTP), Secure Sockets Layer (SSL) Protocol, etc.

It is to be understood that the present disclosure may be implemented in various forms of hardware, software, firmware, special purpose processors, or a combination thereof. The IED may also include an operating system and micro instruction code. The various processes and functions described herein may either be part of the micro instruction code or part of an application program (or a combination thereof) which is executed via the operating system.

It is to be further understood that because some of the constituent system components and method steps depicted in the accompanying figures may be implemented in software, the actual connections between the system components (or the process steps) may differ depending upon the manner in which the present disclosure is programmed. Given the teachings of the present disclosure provided herein, one of ordinary skill in the related art will be able to contemplate these and similar implementations or configurations of the present disclosure.

As the IED 100 collects data and processes the collected data, the data will be stored on, for example, flash memory 128. The data may be stored in various types of logs, e.g., a historical trend log which is a collection of time-stamped records used to track any parameter over time. Other exemplary logs may include limit logs, event-triggered waveforms logs (e.g., records a waveform when a user-programmable value goes out of limit and when the value returns to normal), power quality logs (e.g., records magnitude and duration of voltage and current surges and sags for every power quality event), status change (input) logs, control output (relay) logs, system event logs, flicker logs and reset logs.

Additionally, the IED 100 includes a serializer/deserializer 138. The serializer portion receives a plurality of input data lines from CPU 118 and converts the individual pieces of data into a single, serial and/or data stream which can be transmitted over at least one single cable, as will be described in more detail below in relation to FIG. 3. It is to be appreciated that the at least one single cable will include at least two conductors where the at least first conductor is the data out line and the at least second conductor is the clock line. The deserializer portion receives a single stream of data from a source external to the IED 100 and converts the stream of data into individual lines of data.

It is understood that the present disclosure is not limited to any particular integrated circuit chip and various types of circuitry can be used. For example, the number of input/output lines of the serializer/deserializer 138 is not essential to the present disclosure and will be dictated by the application being implemented for a particular use. It is further to be appreciated that if only one way communication is needed, e.g., an IED and a remote display, the IED may only include a serializer and the remote device will only include a deserializer.

Figure 3:
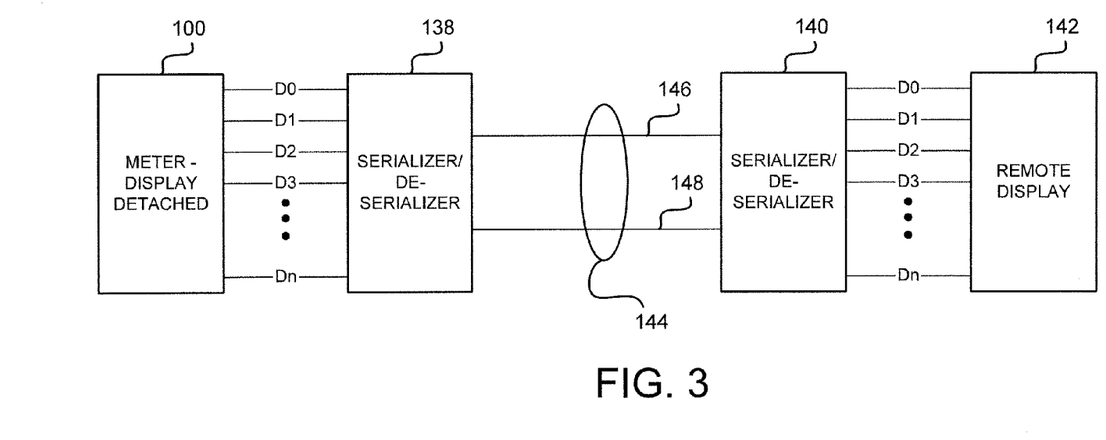
FIG. 3 is a block diagram of a data transmission system and method for transmitting data from an IED in accordance with an embodiment of the present disclosure.

Referring now to FIG. 3, an embodiment in accordance with the present disclosure of a cost effective data transmission method and system for data transmission between an IED 100 (shown with a display detached from the IED) and a remote display 142 is provided. The IED 100 can have any number of data lines from Do to Dn where n can be any integer number for transmitting data to a remote display 142.

Each of the data lines Do to Dn are input to the serializer/deserializer 138. In one embodiment, a plurality of individual output lines are coupled from the CPU 118 to the serializer/deserializer 138. In another embodiment, a single bus of data leaves the CPU 118, where the bus is coupled to a predetermined number of output drivers and the output drivers are coupled to the inputs of the serializer/deserializer 138.

The serializer/deserializer 138 converts a parallel set of data lines, e.g., a parallel data bus such as Do to Dn, to a serial or other data transmission stream thus permitting the serialized data transmission stream to be transmitted over a single line rather than n lines as would otherwise be required for the n lines of data (Do to Dn) to the IED display 134. The serialized or other data is then transmitted over a serial or other link 144 to a second serializer/deserializer 140 where the serialized stream of data from the IED 100 is converted back into the parallel bus of data (Do to Dn) and inputted to the remote display 142. It is to be appreciated that the serial or other link 144 is coupled to the serializer portion of 138 and to the deserializer portion of 140.

In the embodiment of FIG. 3, the serial or other link 144 includes two transmission lines, i.e., a first line 146 for transmission of data and a second line 148 for clocking or synchronizing the data being output along line 146. The link 144 can be formed of any media such as copper or fiber optic material. It is to be appreciated that fiber optic material will result in a faster data transmission.

Figure 4:
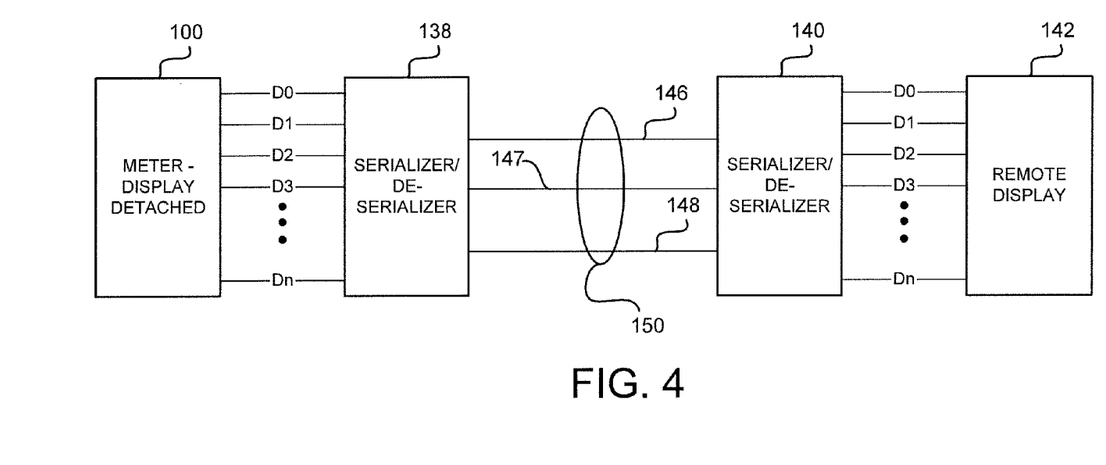
FIG. 4 is a block diagram of a data transmission system and method for transmitting data from an IED in accordance with another embodiment of the present disclosure.

In the embodiment of FIG. 4, the serial or other link 150 includes an at least two sync channel. As described above, the two sync channel 150 includes a first line 146 for transmission of data and a second line 148 for clocking or synchronizing the data being output along line 146. A second channel 147 permits the deserializer portion of 140 to communicate with the serializer portion of 138 to determine if a particular data line e.g. Do, is ready to transmit without interfering with any data transmission that might be occurring at that time on the first data channel 146 which is transmitting from the serializer portion of 138 to the deserializer portion of 140.

The link 144, 150 can be formed of any media such as copper or fiber optic material. It is to be appreciated that fiber optic material will result in a faster data transmission. Additionally, in the remote display embodiment, fiber optic material will provide isolation to separate the IED having high voltage from the human interface of the display. Therefore, if there is a short or stray voltage, it will not be transmitted to the display.

Figure 5:
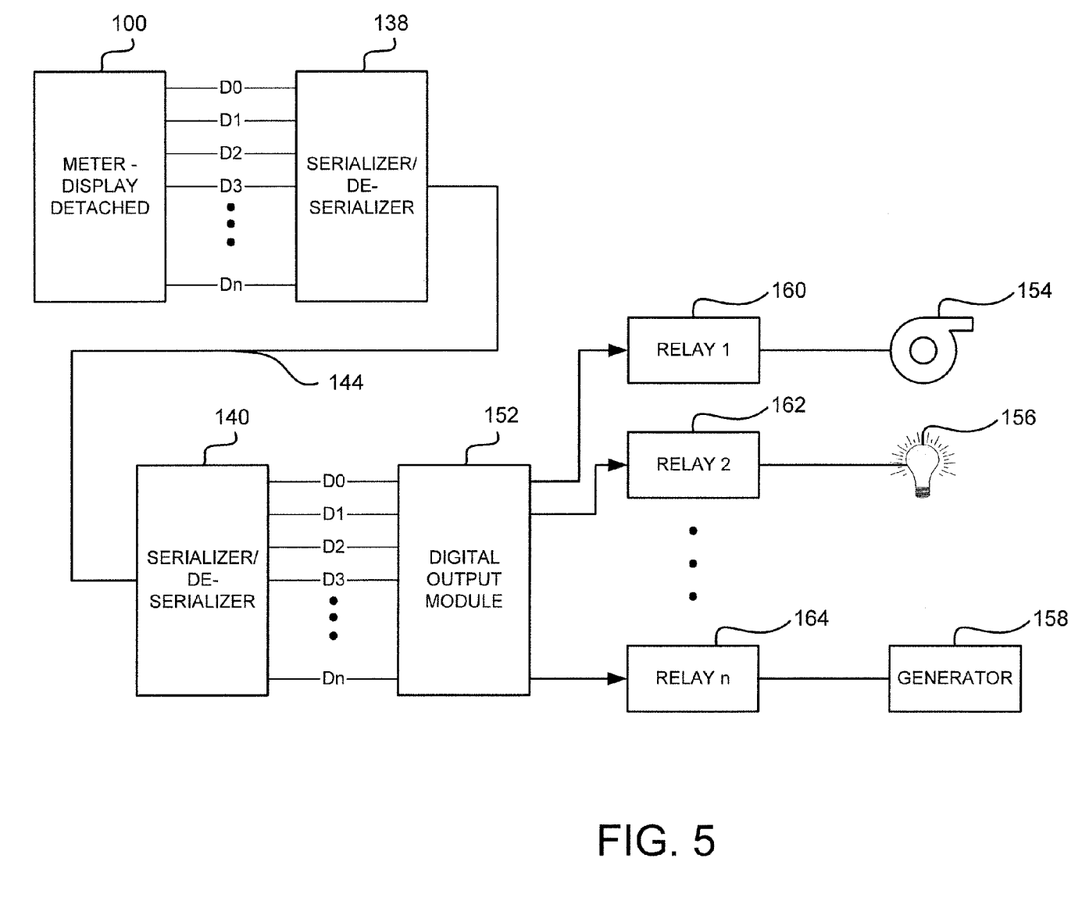
FIG. 5 is a block diagram of a data transmission system for transmitting data from an IED to a remote device over a single serial link in accordance with an embodiment of the present disclosure.

It is to be appreciated that the teachings of the present disclosure apply to other remote devices in addition to a remote display. For example, referring to FIG. 5, a digital output module 152 may be located remotely from the IED 100. Conventionally, an IED 100 may control several pieces of equipment, e.g., a fan 154, lighting 156, a generator 158, etc., based on algorithms or logic programmed in the IED 100. If the equipment 154, 156, 158 is located in, for example, a different part of a building or campus, than the IED 100, a cable is required to be run to each piece of equipment. For example, if eight pieces of equipment are to be controlled, eight cables will be run from the IED to a digital output module which will subsequently control the equipment via a relay 160, 162, 164. In accordance with the teachings of the present disclosure, by utilizing a serializer/deserializer at the IED 100 and at the digital output module 152, only one cable will be required to be run from the IED 100 to the digital output module 152. Cables will then only need to be run from the digital output module 152 to the equipment locally.

Thus the present disclosure provides for a system and method for transmitting multiple lines of data through a one or two channel link thereby reducing the costs of multiple lines for data transmission and also permitting the data to be transmitted rapidly and cost effectively. It is to be appreciated that at least one embodiment of the above described system will operate faster than Ethernet since there is no overhead because no protocol, e.g., TCP/IP, is required. Furthermore, in embodiments where the link 144 is a dedicated line, there is no burden on the line as in a network such as Ethernet where the medium, e.g., CAT 5 cabling, is being shared.

Although the disclosure herein has been described with reference to particular illustrative embodiments, it is to be understood that these embodiments are merely illustrative of the principles and applications of the present disclosure. Therefore numerous modifications may be made to the illustrative embodiments and other arrangements may be devised without departing from the spirit and scope of the present disclosure, which is defined by the appended claims.

Furthermore, although the foregoing text sets forth a detailed description of numerous embodiments, it should be understood that the legal scope of the present disclosure is defined by the words of the claims set forth at the end of this patent. The detailed description is to be construed as exemplary only and does not describe every possible embodiment, as describing every possible embodiment would be impractical, if not impossible. One could implement numerous alternate embodiments, using either current technology or technology developed after the filing date of this patent, which would still fall within the scope of the claims.

It should also be understood that, unless a term is expressly defined in this patent using the sentence "As used herein, the term '________' is hereby defined to mean . . . " or a similar sentence, there is no intent to limit the meaning of that term, either expressly or by implication, beyond its plain or ordinary meaning, and such term should not be interpreted to be limited in scope based on any statement made in any section of this patent (other than the language of the claims). To the extent that any term recited in the claims at the end of this patent is referred to in this patent in a manner consistent with a single meaning, that is done for sake of clarity only so as to not confuse the reader, and it is not intended that such claim term be limited, by implication or otherwise, to that single meaning. Finally, unless a claim element is defined by reciting the word "means" and a function without the recital of any structure, it is not intended that the scope of any claim element be interpreted based on the application of 35 U.S.C. §112, sixth paragraph.

What is claimed is:

1. An intelligent electronic device (IED) comprising:
at least one sensor configured for sensing at least one electrical parameter of electrical power distributed from an electrical distribution system to a load;
at least one analog-to-digital converter coupled to the at least one sensor and configured for converting an analog signal output from the at least one sensor to digital data;
at least one processing unit coupled to the at least one analog-to-digital converter configured to receive the digital data, output a first plurality of data signals along a plurality of output data lines and receive a second plurality of data signals along a plurality of input data lines; and
a communication module including a first serializer and a first deserializer,
the first serializer having a plurality of input data lines coupled to the plurality of output data lines of the at least one processing unit and configured to convert the first plurality of data signals received from the at least one processor to a first serial data transmission stream to be transmitted to at least one external device, and the first deserializer having a plurality of output data lines coupled to the plurality of input data lines of the at least one processing unit and configured to receive a second serial data transmission stream from the at least one external device and convert the second serial data transmission stream into the second plurality of data signals, the second plurality of data signals being input to the plurality of input data lines of the at least one processing unit.

2. The intelligent electronic device (IED) as in claim 1, wherein the first serializer and first deserializer are disposed on a single, integrated circuit chip.

3. The intelligent electronic device (IED) as in claim 1, further comprising a serial link for coupling the communication module to the at least one external device.

4. The intelligent electronic device (IED) as in claim 3, wherein the serial link is formed of copper material as the medium.

5. The intelligent electronic device (IED) as in claim 3, wherein the serial link is formed of fiber optic material as the medium.

6. The intelligent electronic device (IED) as in claim 3, wherein the at least one external device is a remote display, the remote display including:
 a second deserializer for receiving the first serial data transmission stream from the first serializer, converting the received first serial data transmission stream back into the plurality of data signals and outputting the data signals along a second plurality of output data lines; and
 a plurality of display signal inputs for receiving data to be displayed on a front face of the remote display, each of the plurality of display signal inputs being coupled to the second plurality of output data lines of the second deserializer.

7. The intelligent electronic device (IED) as in claim 6, wherein the serial link includes a first transmission path for the data of the plurality of data signals and a second transmission path for a clock signal for synchronizing the data on the first transmission path.

8. The intelligent electronic device (IED) as in claim 7, wherein the remote display further includes:
 a plurality of display signal outputs representative of inputs received on the front face of the remote display, each of the plurality of display signal outputs being coupled to a plurality of inputs on a second serializer; and
 the second serializer for receiving the plurality of display signal outputs from the front face and converting the received plurality of display signal outputs into a third serial data transmission stream to be transmitted back to the first deserializer.

9. The intelligent electronic device (IED) as in claim 8, wherein the serial link is formed of fiber optic material as the medium, wherein the fiber optic material electrically isolates the remote display from the IED.

10. The intelligent electronic device (IED) as in claim 8, wherein the IED and the remote display each include a serializer and deserializer in a single, integrated circuit chip.

11. The intelligent electronic device (IED) as in claim 3, wherein the IED and the at least one external device each include a serializer and deserializer in a single, integrated circuit chip.

12. The intelligent electronic device (IED) as in claim 3, wherein the at least one external device is an input/output module.

13. The intelligent electronic device (IED) as in claim 3, wherein the serial link is formed of fiber optic material as the medium, wherein the fiber optic material electrically isolates the at least one external device from the IED.

14. The intelligent electronic device (IED) as in claim 3, wherein the at least one external device is a computing device.

15. The intelligent electronic device (IED) as in claim 3, wherein the at least one external device is at least one second intelligent electronic device.

16. The intelligent electronic device (IED) as in claim 3, wherein the serial link includes a first transmission path for the data of the plurality of data signals and a second transmission path for a clock signal for synchronizing the data on the first transmission path.

17. The intelligent electronic device (IED) as in claim 16, wherein the serial link includes at least one second transmission path configured to enable communication from the at least one external device.

18. The intelligent electronic device (IED) as in claim 1, wherein the at least one sensor, at least one analog to digital converter, at least one processing unit and the communication module are disposed in a socket-type meter form.

19. The intelligent electronic device (IED) as in claim 1, wherein the at least one sensor, at least one analog to digital converter, at least one processing unit and the communication module are disposed in a panel mounted meter form.

20. The intelligent electronic device (IED) as in claim 1, wherein the at least one sensor, at least one analog to digital converter, at least one processing unit and the communication module are disposed in a switchboard meter form.

21. The intelligent electronic device (IED) as in claim 1, wherein the at least one sensor, at least one analog to digital converter, at least one processing unit and the communication module are disposed in a circuit breaker mounted meter form.

22. The intelligent electronic device (IED) as in claim 1, further comprising a housing including a plurality of current terminals and a plurality of voltage terminals, wherein the terminals are configured to mate with matching jaws of a detectable meter-mounting device.

23. A method for data transmission from an intelligent electronic device (IED) to a remote display, the method comprising:
 outputting a plurality of data signals along a plurality of data lines from at least one processor of an intelligent electronic device (IED), the data signals indicative of sensed electrical parameters of electrical power distributed from an electrical distribution system to a load;
 converting the plurality of data signals to a serial data transmission stream;
 transmitting the serial data transmission stream through a serial link, the serial link coupling the IED to the remote display;
 receiving the serial data transmission stream at the remote display;
 converting the received serial data transmission stream back into the plurality of data signals; and
 inputting the plurality of data signals to a corresponding plurality of inputs on the remote display.

24. The method as in claim 23, wherein the serial link is formed of fiber optic material as the medium, wherein the fiber optic material electrically isolates the remote display from the IED.

25. A data transmission system for transmitting data from an intelligent electronic device (IED) to a remote display, comprising:
 an intelligent electronic device comprising:

at least one sensor configured for sensing at least one electrical parameter of electrical power distributed from an electrical distribution system to a load;

at least one analog-to-digital converter coupled to the at least one sensor and configured for converting an analog signal output from the at least one sensor to digital data;

at least one processing unit coupled to the at least one analog-to-digital converter configured to receive the digital data and generate a plurality of outputs; and a serializer for converting the plurality of outputs to a serial data transmission stream;

a serial link for transmitting the serial data transmission stream to a remote display; and the remote display comprising:

a deserializer for converting the received serial data transmission stream back into the plurality of outputs; and a plurality of inputs for receiving data to be displayed on a front face of the remote display, each of the plurality of inputs being coupled to the plurality of outputs of the deserializer.

26. The system as in claim 25, wherein the serial link is formed of fiber optic material as the medium, wherein the fiber optic material electrically isolates the remote display from the IED.

27. The system as in claim 25, wherein the intelligent electronic device is a socket-type power meter.

28. The system as in claim 25, wherein the intelligent electronic device is a power meter.

29. The system as in claim 25, wherein the serial link includes a first transmission path for the data of the plurality of data signals and a second transmission path for a clock signal for synchronizing the data on the first transmission path.

30. The system as in claim 29, wherein the serial link includes at least one second transmission path configured to enable communication from the remote display.

31. A data transmission system comprising:

an intelligent electronic device comprising:

at least one sensor configured for sensing at least one electrical parameter of electrical power distributed by an electrical distribution system to a load;

at least one analog-to-digital converter coupled to the at least one sensor and configured for converting an analog signal output from the at least one sensor to digital data;

at least one first processing unit coupled to the at least one analog-to-digital converter configured to receive the digital data and generate a plurality of outputs; and a serializer for converting the plurality of outputs to a serial data transmission stream;

a fiber optic link for coupling the intelligent electronic device to a remote device and for transmitting the serial data transmission stream to the remote device; and the remote device comprising:

a deserializer for converting the received serial data transmission stream back into the plurality of outputs; and at least one second processing unit including a plurality of inputs, the plurality of inputs being coupled to the plurality of outputs of the deserializer.

32. The data transmission system as in claim 31, wherein the fiber optic link includes at least one channel.

33. The data transmission system as in claim 31, wherein the fiber optic link includes at least two channels.

34. The data transmission system as in claim 31, wherein the intelligent electronic device is a socket-type power meter.

35. The data transmission system as in claim 31, wherein the intelligent electronic device is a power meter.

36. The data transmission system as in claim 31, wherein the remote device is an input/output module.

37. The data transmission system as in claim 31, wherein the remote device is a computing device.

38. The data transmission system as in claim 31, wherein the remote device is at least one second intelligent electronic device.

* * * * *